(12) United States Patent
Lai

(10) Patent No.: US 10,784,238 B2
(45) Date of Patent: Sep. 22, 2020

(54) DISPLAY DEVICE INCLUDING SUB-PIXEL UNITS OF THE SAME COLOR TYPE AND DIFFERENT LUMINOUS AREAS

(71) Applicant: PLAYNITRIDE INC., Zhubei, Hsinchu County (TW)

(72) Inventor: Yu-Hung Lai, Zhubei (TW)

(73) Assignee: PLAYNITRIDE INC., Zhubei (TW)

(*) Notice: Subject to any disclaimer, the term of this patent is extended or adjusted under 35 U.S.C. 154(b) by 0 days.

(21) Appl. No.: 16/455,631

(22) Filed: Jun. 27, 2019

(65) Prior Publication Data

US 2019/0319017 A1  Oct. 17, 2019

Related U.S. Application Data

(63) Continuation-in-part of application No. 15/496,880, filed on Apr. 25, 2017, now abandoned.

(30) Foreign Application Priority Data

Mar. 8, 2017  (TW) .............................. 106107605 A (51) Int. Cl.
*H01L 25/075* (2006.01)
*H01L 27/32* (2006.01)

(52) U.S. Cl.
CPC ...... *H01L 25/0753* (2013.01); *H01L 27/3216* (2013.01); *H01L 27/3218* (2013.01)

(58) Field of Classification Search
CPC ..... H01L 27/156; H01L 33/08; H01L 33/025;
H01L 33/22; H01L 21/02573; H01L 33/14; H01L 27/14605; H01L 27/3211–3218; H01L 25/0753; H01L 22/10; H01L 22/20
See application file for complete search history.

(56) References Cited

U.S. PATENT DOCUMENTS

| | | | |
|---|---|---|---|
| 2017/0236807 A1* | 8/2017 | Hwang | H01L 33/32 257/90 |
| 2017/0278906 A1* | 9/2017 | Song | H01L 27/326 |
| 2018/0151637 A1* | 5/2018 | Kajiyama | H01L 27/3216 |

* cited by examiner

*Primary Examiner* — Nelson Garces
(74) *Attorney, Agent, or Firm* — Maschoff Brennan (57) ABSTRACT

Disclosed are an epitaxial wafer and a display device that includes a display substrate, a first sub pixel unit and a second sub pixel unit. The first sub pixel unit has a first luminous area, and the second sub pixel unit has a second luminous area different from the first luminous area. The first sub pixel unit and the second sub pixel unit belong to the same color type and are located in different pixel units. The first sub pixel unit is a sub epitaxial structure emitting light within a first photoluminescent wavelength, the second sub pixel unit is a sub epitaxial structure emitting light within a second photoluminescent wavelength, and the first photoluminescent wavelength is different from the second photoluminescent wavelength. The difference between electroluminescent wavelengths of the first sub pixel unit and the second sub pixel unit is less than or equal to 2 nm.

15 Claims, 4 Drawing Sheets

DISPLAY DEVICE INCLUDING SUB-PIXEL UNITS OF THE SAME COLOR TYPE AND DIFFERENT LUMINOUS AREAS

CROSS-REFERENCE TO RELATED APPLICATIONS

This non-provisional application is a continuation-in-part application of U.S. patent application Ser. No. 15/496,880, filed on Apr. 25, 2017, which claims priority under 35 U.S.C. § 119(a) on Patent Application No(s). 106107605 filed in Taiwan, R.O.C. on Mar. 8, 2017, the entire contents of which are hereby incorporated by reference.

TECHNICAL FIELD

The disclosure relates to a display device and an epitaxial wafer, more particularly to a display device displaying images via light emitting diodes (LEDs), and a LED epitaxial wafer.

RELATED ART

LEDs characterized by high energy conversion efficient, small in size and long-life have widely been applied to various electronic products. Usually, LEDs are used for indictors or lighting, or are used in a display device for display images. In brief, a LED has an illumination layer and at least two types of semiconductor layers, so manufacturers can produce different color LEDs by adjusting the material of the illumination layer and the materials of the semiconductor layers.

However, the semiconductor layers in various regions of the same wafer may have different epitaxial qualities during an epitaxy process. The uneven quality of epitaxy may cause the occurrence of deviation to the peak wavelengths of light emitted by LEDs that are driven. That is, a certain batch of LEDs, initially expected to emit the same color light, have a difference in color of light therebetween due to their uneven epitaxial qualities; the difference in color of light is even sensible to human's eyes.

Moreover, the microminiaturization of LEDs is very expectative in the next generation of semiconductor technology. The existing technology has been able to shrink LEDs down to a micrometer scale. However, since the sizes of LEDs are getting smaller, it becomes a very key factor to various LEDs whether the epitaxial quality of various LEDs is even or not. For some manufacturing processes of display panels, micro LEDs are formed by the same epitaxial wafer in a chip manufacturing process and then transferred to a substrate having driving circuits therein by the mass transfer technology. In other words, there is no chance to additionally classify LEDs during the manufacturing process. Therefore, when these LEDs with different epitaxial qualities are disposed in the same display device, the image quality of the display device will be affected, and the yield rate of production will also decrease.

SUMMARY

According to one or more embodiments, the disclosure provides a display device. The display device includes a display substrate, a first pixel unit and a second pixel unit. The first pixel unit is located on the display substrate and includes a first sub pixel unit having a first luminous area. The second pixel unit is located on the display substrate and includes a second sub pixel unit having a second luminous area, and the first luminous area and the second luminous area is different. The first sub pixel unit and the second sub pixel unit belong to the same color type. The first sub pixel unit and the second sub pixel unit are located in different pixel units. The first sub pixel unit is from a sub epitaxial structure emitting light within a first photoluminescent wavelength, the second sub pixel unit is from a sub epitaxial structure emitting light within a second photoluminescent wavelength, and the first photoluminescent wavelength is different from the second photoluminescent wavelength. The difference between a first electroluminescent wavelength of the first sub pixel unit and a second electroluminescent wavelength of the second sub pixel unit is less than or equal to 2 nm.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
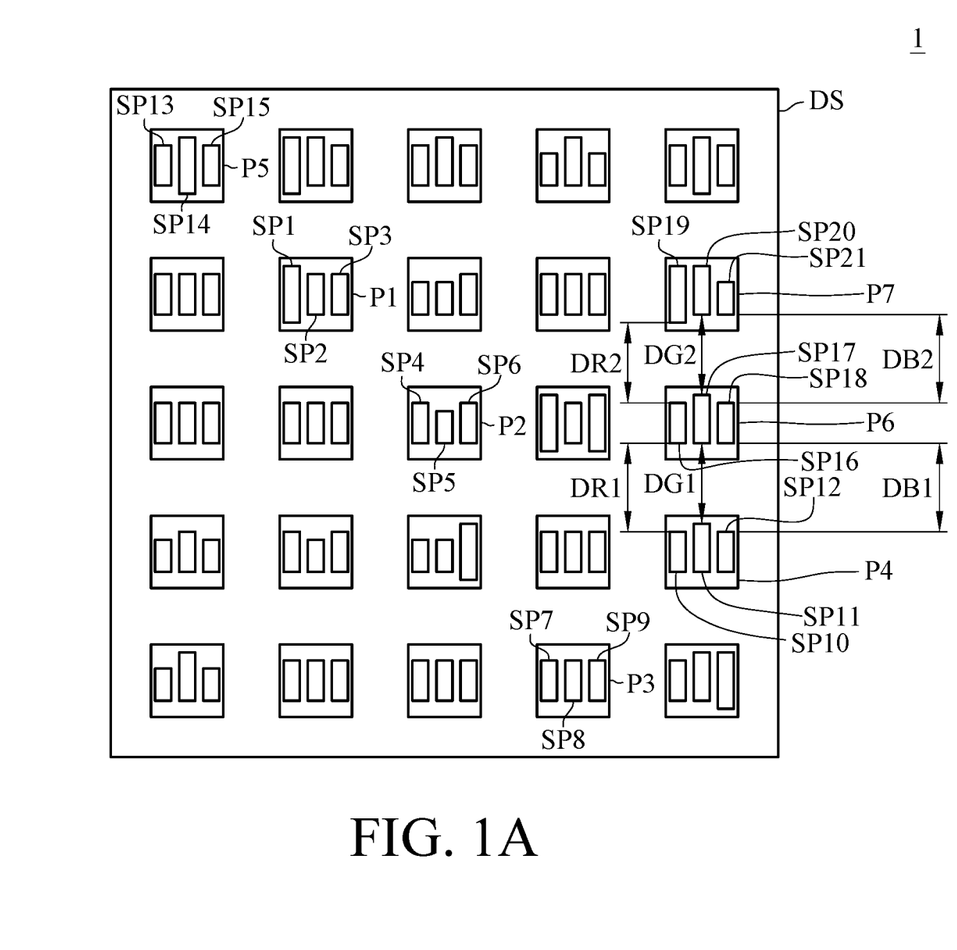
FIG. 1A is a top view of a display device according to an embodiment of the disclosure.

Please refer to FIG. 1A. FIG. 1A is a top view of a display device according to an embodiment of the disclosure. As shown in FIG. 1A, a display device 1 includes a display substrate DS and a plurality of pixel units. The plurality of pixel units is disposed on the display substrate DS. For a concise description, only 25 pixel units are shown in FIG. 1 and are arranged in an array. The following description will exemplify the pixel units P1, P2, P3, P4 and P5 of the 25 pixel units. However, the number of pixel units and the arrangement of the pixel units are not limited to what the figures show.

In the case of the pixel unit P1, the pixel unit P1 includes sub pixel units SP1, SP2 and SP3. For example, the sub pixel units SP1, SP2 and SP3 respectively emit light of different colors. In another aspect, the sub pixel units SP1, SP2 and SP3 belong to different color types, respectively. In an embodiment, the sub pixel unit SP1 emits red light, the sub pixel unit SP2 emits green light, and the sub pixel unit SP3 emits blue light. For other pixel units, the correlation among sub pixel units SP4, SP5 and SP6 in the pixel unit P2 is similar to that among the sub pixel units SP1, SP2 and SP3. That is, the sub pixel unit SP4 and the sub pixel unit SP1 belong to the same color type, the sub pixel unit SP5 and the sub pixel unit SP2 belong to the same color type, and the sub pixel unit SP6 and the sub pixel unit SP3 belong to the same color type. The related detail will not be repeatedly described hereafter. Different sub pixel units of the same color type are classified into a first sub pixel unit and a second sub pixel unit. For example, the sub pixel unit SP1 is defined as a first sub pixel unit, and the sub pixel unit SP4 is defined as a second sub pixel unit.

Figure 1B:
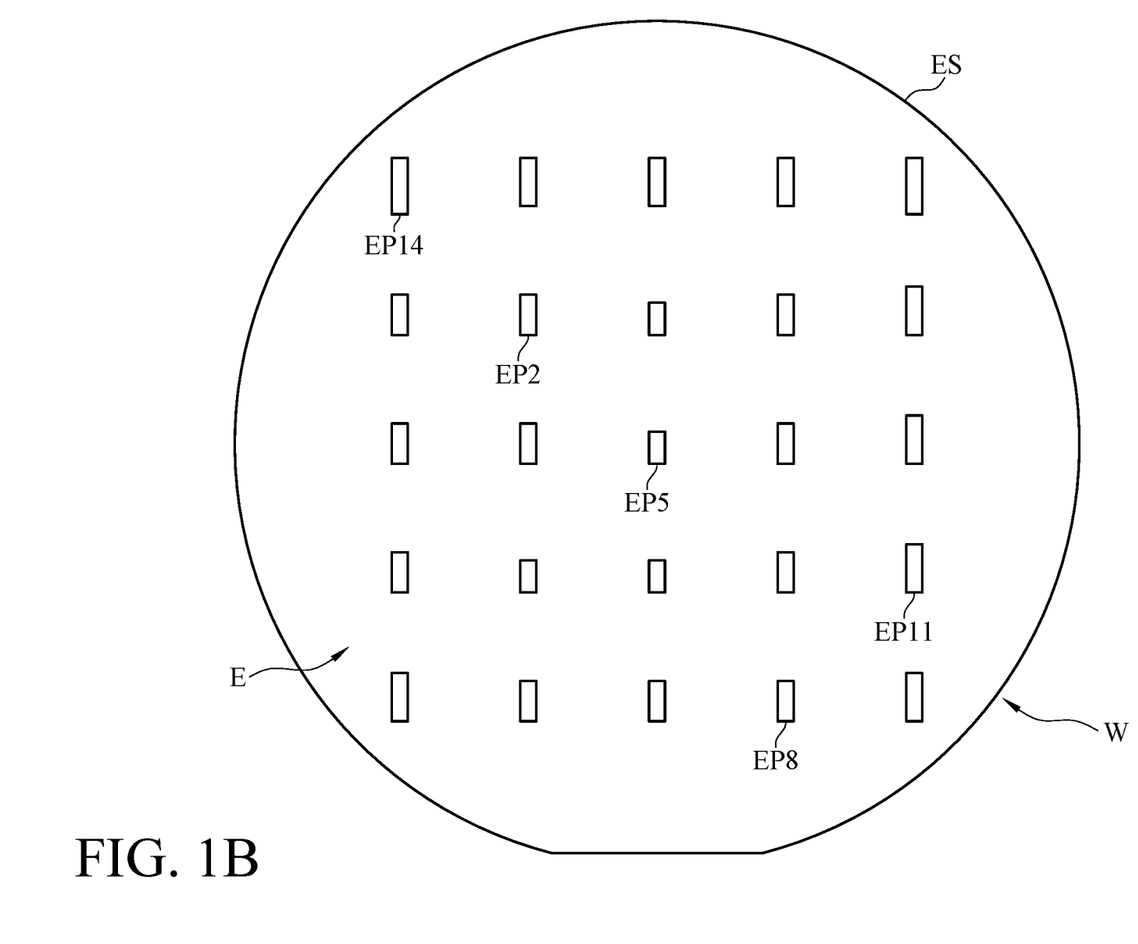
FIG. 1B is a top view of an epitaxial wafer according to an embodiment of the disclosure.

In a particular example, the aforementioned sub pixel units of the same color type are formed from the epitaxial structure of the same epitaxial wafer and then is transferred to the display substrate DS. However, in some embodiments, the sub pixel units of the same color type are respectively formed from the epitaxial structures of different epitaxial wafers. Please further refer to FIG. 1B. FIG. 1B is a top view of an epitaxial wafer according to an embodiment of the disclosure. As shown in FIG. 1B, an epitaxial wafer W includes an epitaxial substrate ES and an epitaxial structure E formed on the epitaxial substrate ES. The epitaxial structure E contains one or more materials of II-VI group or one or more III-V nitrogen compound materials. Preferably, the thickness of the epitaxial structure E is not larger than 6 μm but is usually larger than 1 μm, because the thickness being too thick or too thin will affect the production yield of the follow-up manufacturing process. For example, the epitaxial substrate ES is a sapphire substrate, silicon substrate or a GaN substrate.

The sub pixel units SP2, SP5, SP8, SP11 and SP14 are formed by directly transferring LED chips to the display substrate DS in the display device 1 after the LED chips are formed from sub epitaxial structures EP2, EP5, EP8, EP11 and EP14, defined in the epitaxial structure E of the epitaxial wafer W in a chip manufacturing process; or, the sub pixel units SP2, SP5, SP8, SP11 and SP14 are formed by transferring LED chips from a provisional substrate (not shown in drawings) to the display substrate DS in the display device 1 after the LED chips are formed from the sub epitaxial structures EP2, EP5, EP8, EP11 and EP14, defined in the epitaxial structure E of the epitaxial wafer W in a chip manufacturing process, and then is transferred to the provisional substrate (not shown in drawings). By transferring such sub pixel units of different color types to the display substrate DS, various pixel units are initially defined. Note that, in the same direction, the sub pixel units of the same color type in every two adjacent pixel units substantially have the same pitch therebetween on the display substrate DS. For example, the pitch between the sub pixel units SP2 and SP5 is substantially equal to the pitch between the sub pixel units SP2 and SP14 in the same direction. Therefore, the display device 1 may provide better display quality and visual experience to viewers.

In this embodiment, the display device 1 includes pixel units P1~P5, and each pixel unit includes at least one red sub pixel unit, at least one blue sub pixel unit, and at least one green sub pixel unit. In a detailed example, multiple red sub epitaxial structures are formed on a first epitaxial wafer, multiple green sub epitaxial structures are formed on a second epitaxial wafer, and multiple blue sub epitaxial structures are formed on a third epitaxial wafer; and then, LED chips are respectively formed from the sub epitaxial structures on the first, second and third epitaxial wafers in a chip manufacturing process and then are directly or indirectly transferred to the display substrate for forming the sub pixel units of the display device. After that, these sub pixel units can further be connected to a driving circuit on the display substrate. For the sub pixel units SP2, SP5, SP8, SP11 and SP14, their relative position before they are formed from the epitaxial wafer W, is substantially the same as the relative position of the sub pixel units SP2, SP5, SP8, SP11 and SP14 on the display substrate DS. In other words, the relative position of the sub epitaxial structures EP2, EP5, EP8, EP11 and EP14, before being used to form the sub pixel units SP2, SP5, SP8, SP11 and SP14 on the epitaxial wafer W, is substantially the same as the relative position of the sub pixel units SP2, SP5, SP8, SP11 and SP14 on the display substrate DS. In brief, the sub pixel units SP2, SP5, SP8, SP11 and SP14 correspond to the sub epitaxial structures EP2, EP5, EP8, EP11 and EP14, the following exemplary description will mainly focus on the sub pixel units SP2, SP5, SP8, SP11 and SP14.

As described above, an example based on the sub pixel units SP2 and SP5 is taken as follows. The sub pixel unit SP2 has a first luminous area, and the sub pixel unit SP5 has a second luminous area. The first luminous area and the second luminous area have the same geometric shape, and the sizes of the first and second luminous areas are related to a photoluminescence measurement result of the epitaxial substrate in an epitaxial process. In this and the following embodiments, each sub pixel unit is exemplarily defined to be rectangle-shaped, but other shapes, such as a circular shape, may be contemplated in this or some embodiments. In this case, each of the sub pixel units SP2, SP5, SP8, SP11 and SP14 has a maximum width ranging from 1 to 100 μm, and preferably ranging from 3 to 30 μm. That is, the scale of each of the sub pixel units SP2, SP5, SP8, SP11 and SP14 is a micrometer scale. Therefore, the display device may have a better display resolution. Note that the driving current density of each of the sub pixel units SP2, SP5, SP8, SP11 and SP14 on the micrometer scale falls in a preferable range between 0.001 A/cm2 and 5 A/cm2 in a low current operation. That is, the sub pixel units SP2, SP5, SP8, SP11 and SP14 may have better efficiency under low driving current density.

According to the present disclosure, for any two pixel units each including a sub pixel unit belonging to a first color type and another sub pixel unit belonging to a second color type different from the first same color type, and a sum of luminous areas of the sub pixel units belonging to the first color type is different from a sum of luminous areas of the sub pixel units belonging to the second color type. Referring to FIG. 1A, the sub pixel unit SP1 of the pixel unit P1 and the sub pixel unit SP4 of the pixel unit P2 belong to red type (emit red light), and the sub pixel unit SP2 of the pixel unit P1 and the sub pixel unit SP5 of the pixel unit P2 belong to green type (emit green light). In this embodiment, a sum of luminous areas of the sub pixel units SP1, SP4 belonging to red type (that is, a sum of the luminous areas of sub pixel units SP1 and SP4) is different from a sum of luminous areas of the sub pixel units SP2, SP5 belonging to green type (that is, a sum of the luminous areas of sub pixel units SP2 and SP5). Similarly, either the sum of luminous areas of the sub pixel units SP1, SP4 or the sum of luminous areas of the sub pixel units SP2, SP5 is different from a sum of luminous areas of the sub pixel units SP3, SP6 belonging to blue type.

According to the present disclosure, for any two pixel units each including a plurality of sub pixel units, a sum of luminous areas of the sub pixel units of one pixel unit is different from a sum of luminous areas of the sub pixel units of the other pixel unit. Referring to FIG. 1A, for the two pixel units P1 and P2, a sum of luminous areas of the sub pixel units of the pixel unit P1 (that is, a sum of the luminous areas of sub pixel units SP1, SP2 and SP3) is different from a sum of luminous areas of the sub pixel units of the pixel unit P2 (that is, a sum of the luminous areas of sub pixel units SP4, SP5 and SP6).

According to the present disclosure, the pixel unit P4, a pixel unit P6 and a pixel unit P7 are linearly arranged in sequence. Referring to FIG. 1A, each of the pixel units P6 and P7 includes three sub pixel units having a correlation similar to the sub pixel units SP10, SP11 and SP12. In detail, the sub pixel units SP10, SP16 and SP19, which are located in respective pixel units P4, P6 and P7, belong to red type. The sub pixel units SP11, SP17 and SP20, which are located in respective pixel units P4, P6 and P7, belong to green type. The sub pixel units SP12, SP18 and SP21, which are located in respective pixel units P4, P6 and P7, belong to blue type. In this embodiment, the minimum distance DR1 between the sub pixel units SP10 and SP16 is different from the minimum distance DR2 between the sub pixel units SP16 and SP19. Similarly, the minimum distance DG1 between the sub pixel units SP11 and SP17 is different from the minimum distance DG2 between the sub pixel units SP17 and SP20. Also, the minimum distance DB1 between the sub pixel units SP112 and SP18 is different from the minimum distance DB2 between the sub pixel units SP18 and SP21.

During the manufacturing process of sub epitaxial structures, the measurement result of one or more relevant test items can be timely provided according to the epitaxial wafer, and compensation and calibration can also be timely performed. For example, the aforementioned photoluminescence measurement result is obtained by measuring the initial light emission result of each part of the epitaxial structure of the epitaxial wafer in a photoluminescence measurement process before the sizes of the sub epitaxial structures are defined on the epitaxial structure. Herein, the photoluminescence measurement process (PL measurement process) is accomplished by light emission from any form of matter after the absorption of photons, that is, photoexcitation. When the sub epitaxial structures are excited with a light source, the sub epitaxial structures emit light within a photoluminescent wavelength. The photoluminescent wavelength can include a peak wavelength or dominant wavelength. In an embodiment, the photoluminescence measurement result includes the information about the peak wavelength distribution. In another embodiment, the photoluminescence measurement result includes the information about a measured luminous intensity distribution. In yet another embodiment, a photoluminescence measurement result includes information about a measured luminous efficiency distribution. More particularly, the peak wavelength distribution, in an example in this embodiment, indicates the peak wavelength of light emitted by each region that is excited on the epitaxial structure of the epitaxial wafer. Since the epitaxial quality of a sub epitaxial structure is related to the location of the sub epitaxial structure in the epitaxial structure, the user can use the correlation to initially judge how each variable in the manufacturing process affects the peak wavelength of light emitted by each sub pixel unit.

Said photoluminescence measurement result is obtained by, for example, measuring the epitaxial structure of the epitaxial wafer by implementing the photoluminescence (PL) measurement process. A standard photoluminescent wavelength range is defined to correspond a standard area on the epitaxial wafer, and the standard peak wavelength range is taken as a reference basis. That is, theoretically, the photoluminescent wavelength obtained from the PL measurement process, such as the peak wavelength of light emitted by a sub epitaxial structure, has the standard area which should fall within the standard peak wavelength range. In an embodiment, the peak wavelength distribution can also be used together with the standard peak wavelength range and a reference luminous area to define various regions in the epitaxial structure of the wafer for compensation and calibration. When the peak wavelength corresponding to a measured position in a certain region of the epitaxial structure is larger than the upper limitation of the standard peak wavelength range, this region will be defined as a positive deviation region. When the peak wavelength corresponding to a measured position in a certain region of the epitaxial structure is shorter than the lower limitation of the standard peak wavelength range, this region will be defined as a negative deviation region. When the peak wavelength corresponding to a measured position in a certain region of the epitaxial structure is not shorter than the lower limitation of the standard peak wavelength range and not larger than the upper limitation of the standard peak wavelength range, this region will be defined as a non-deviation region. In some embodiments, said standard photoluminescent wavelength range is a standard photoluminescent wavelength; that is, the standard photoluminescent wavelength range is directed to a specific value. A region where the peak wavelength of light emitted by a sub epitaxial structure in the PL measurement process is larger than the standard peak wavelength is defined as a positive deviation region. A region where the peak wavelength of light emitted by a sub epitaxial structure in the PL measurement process is equal to the standard peak wavelength is defined as a non-deviation region. A region where the peak wavelength of light emitted by a sub epitaxial structure in the PL measurement process is smaller than the standard peak wavelength is defined as a negative deviation region.

The definitions and amounts of the aforementioned positive deviation region, negative deviation region and non-deviation region or whether to additionally define other regions, can be freely set according to particular requirements in view of the disclosure by one of ordinary skill in the art, and are not limited to the disclosure.

After each sub epitaxial structure is manufactured and transferred to the substrate to form respective sub pixel unit, a driving current is applied to the sub pixel units, and the sub pixel units are excited to emit light within an electroluminescent wavelength by forward-bias electroluminescence. The electroluminescent wavelength can include a peak wavelength or a dominant wavelength. Herein, an electroluminescence measurement process (EL measurement process) is accomplished by light emission from any form of matter in response to the passage of an electric current or to a strong electric field; that is, the driving current is supplied to a light emitting material, and then the light emitting material transforms the driving current into light. In another aspect, assume that the luminous area corresponding to a sub epitaxial structure in a positive deviation region, the luminous area corresponding to a sub epitaxial structure in a non-deviation region, and the luminous area corresponding to a sub epitaxial structure in a negative deviation region are substantially equal to each other. When the same driving current is applied to sub pixel units respectively corresponding to a positive deviation region, a non-deviation region and a negative deviation region among the sub pixel units formed from transferring sub epitaxial structures formed in a chip manufacturing process to a display substrate, the peak wavelength of the electroluminescent wavelength of light emitted by the sub pixel unit corresponding to the positive deviation region is longer than the peak wavelength of light emitted by the sub pixel unit corresponding to the non-deviation region, and the peak wavelength of light emitted by the sub pixel unit corresponding to the negative deviation region is shorter than the peak wavelength of light emitted by the sub pixel unit corresponding to the non-deviation region. The difference in peak wavelength will become larger if the driving current has a low driving current density.

It is noted that the electroluminescence is different from the photoluminescence. Typically, a LED emits light by electroluminescence. However, the EL measurement process is able to be implemented after the pixel units have been mounted on the display substrate. According to the present disclosure, the PL measurement process is implemented to obtain the information about the peak wavelength distribution of the sub epitaxial structures. During the fabrication of sub pixel units from the sub epitaxial structures, one or more process parameters can be fine-tuned in order to optimize the sub pixel units.

To deal with this situation, in an embodiment, the luminous area corresponding to the sub pixel unit in the positive deviation region is smaller than the standard area, the luminous area corresponding to the sub pixel unit in the non-deviation region is substantially equal to the standard area, and the luminous area corresponding to the sub pixel unit in the negative deviation region is larger than the standard area. In practice, the aforementioned standard peak wavelength range can further be narrowed to become a standard peak wavelength. In this condition, a region corresponding to a photoluminescent wavelength longer than the standard peak wavelength is defined as a positive deviation region, a region corresponding to a photoluminescent wavelength substantially equal to the standard peak wavelength is defined as a non-deviation region, and a region corresponding to a photoluminescent wavelength shorter than the standard peak wavelength is defined as a negative deviation region.

Figure 2A:
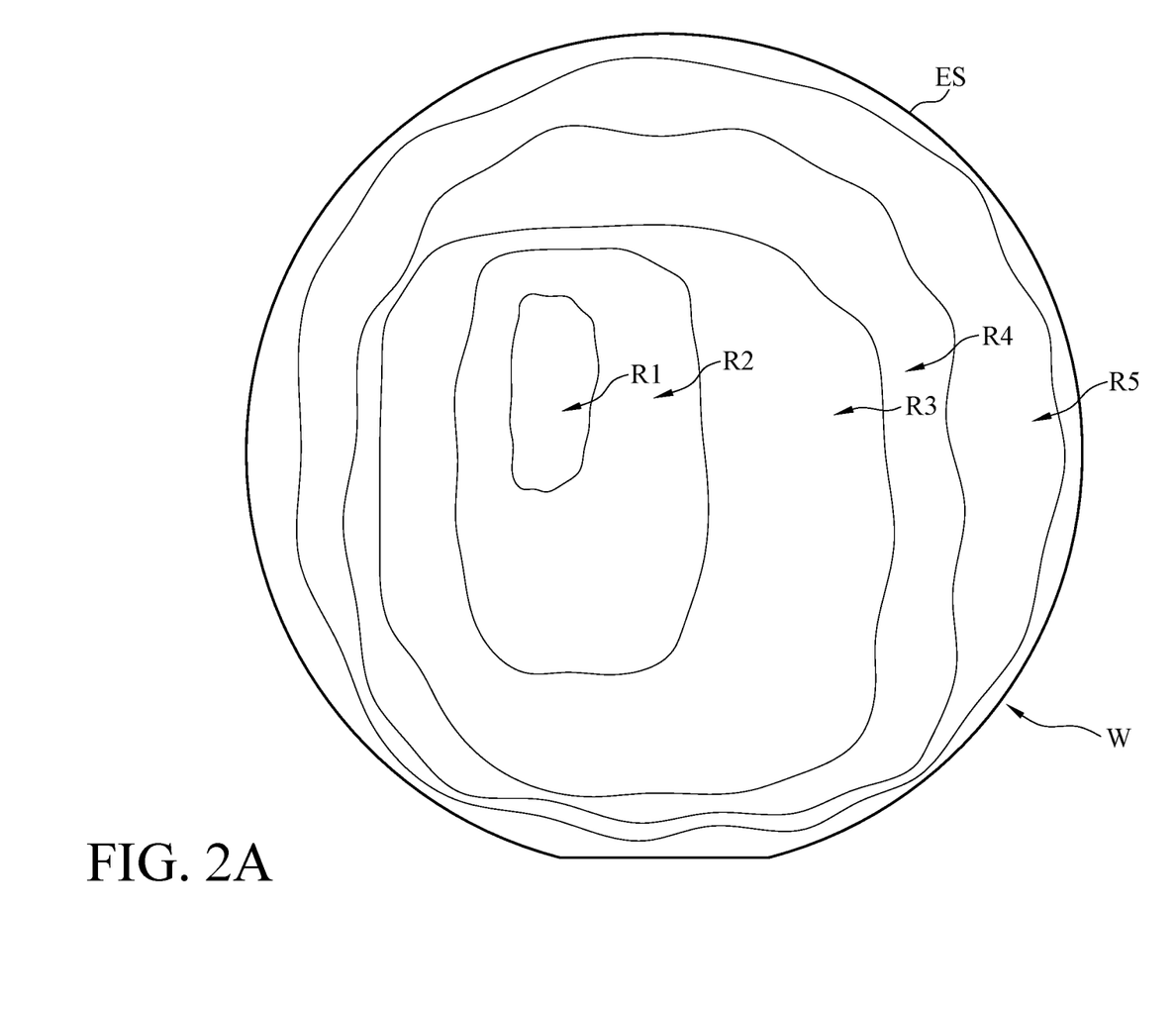
FIG. 2A is a schematic diagram of the photoluminescence measurement result of the epitaxial wafer according to an embodiment of the disclosure.
Figure 2B:
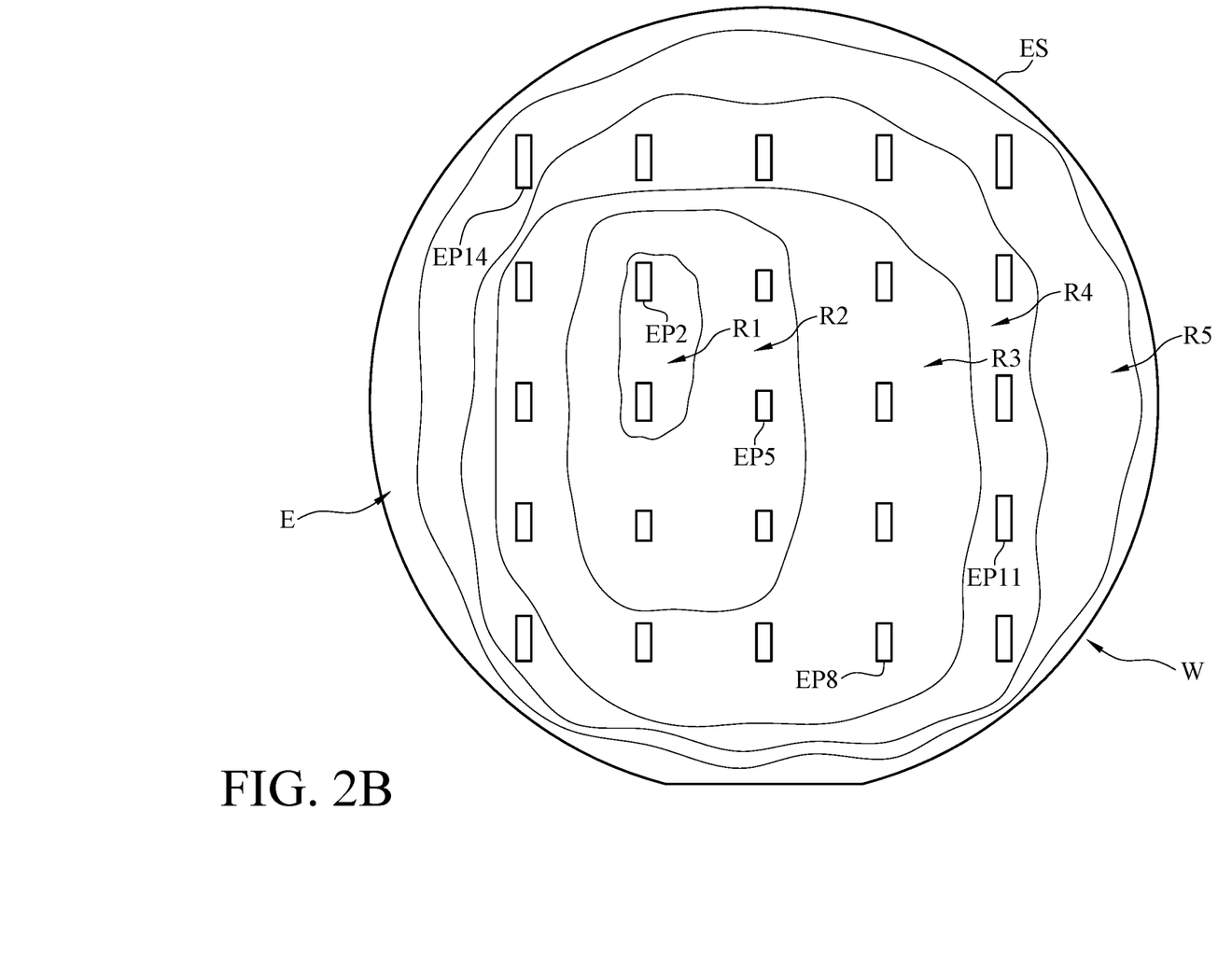
FIG. 2B is a schematic diagram of a comparison of the photoluminescence measurement results of sub pixel units and an epitaxial wafer according to an embodiment of the disclosure.

Next, please refer to FIG. 2A and FIG. 2B. FIG. 2A is a schematic diagram of the photoluminescence measurement result of the epitaxial wafer according to an embodiment of the disclosure, and FIG. 2B is a schematic diagram of a comparison of the photoluminescence measurement results of sub pixel units and an epitaxial wafer according to an embodiment of the disclosure. Concretely, FIG. 2A illustrates the photoluminescent wavelength distribution in the photoluminescence measurement result. Each closed curve in FIG. 2A represents a wavelength, and a region between every two closed curves corresponds to a wavelength range. According to the PL measurement result, the regions R1~R5 have different photoluminescent wavelengths. In other words, the regions R1~R5 in FIG. 2A respectively correspond to different photoluminescent wavelength ranges. In the process of fabricating the sub epitaxial structures, the sub epitaxial structures corresponding to the regions R1~R5 have respective photoluminescent wavelengths in the regions R1~R5. For example, the sub epitaxial structure EP2 has a photoluminescent wavelength corresponding to the region R1, such as a peak wavelength. In practice, the measured luminous intensity distribution or luminous efficiency distribution in the photoluminescence measurement result can be used to produce relevant diagrams or tables, and the disclosure does not intend to limit the use of parameters. The standard peak wavelength range can be 1 nm~8 nm for a better luminous efficiency of the display device.

In the embodiment shown in FIG. 2A, the photoluminescent wavelength corresponding to the region R1 is not longer than the upper limitation of the standard peak wavelength range and is not shorter than the lower limitation of the standard peak wavelength range, so the region R1 can be considered as the aforementioned non-deviation region. The photoluminescent wavelength corresponding to the region R2 is longer than the upper limitation of the standard peak wavelength range, so the region R2 can be considered as the aforementioned positive deviation region. The photoluminescent wavelength corresponding to the region R3 is not longer than the upper limitation of the standard peak wavelength range and is not shorter than the lower limitation of the standard peak wavelength range, so the region R3 can be considered as the aforementioned non-deviation region. The photoluminescent wavelength corresponding to the region R4 is shorter than the lower limitation of the standard peak wavelength range, so the region R4 can be considered as the aforementioned negative deviation region. The photoluminescent wavelength corresponding to the region R5 is shorter than the lower limitation of the standard peak wavelength range, so the region R5 can be considered as the aforementioned negative deviation region. Since the photoluminescent wavelength corresponding to the region R5 is shorter than the photoluminescent wavelength corresponding to the region R4, the photoluminescent wavelength corresponding to the region R5 deviates from the standard peak wavelength range more than the photoluminescent wavelength corresponding to the region R4. The photoluminescent wavelength exceeds the standard peak wavelength range can range from 1 nm to 8 nm to effect the luminous efficiency of the display device.

FIG. 2B is a schematic comparison diagram obtained by superimposing a part of the sub pixel units in FIG. 1A on the photoluminescent wavelength distribution in FIG. 2A for exemplarily illustrating the correlation between the sizes of luminous areas of sub pixel units and the regions R1~R5. As shown in FIG. 1A to FIG. 2B, the sub pixel unit SP2 of the pixel unit P1 formed from the sub epitaxial structure EP2 corresponds to the region R1 of the epitaxial wafer W. The region R1 has a first photoluminescent wavelength range which is not larger than 536 nm and not shorter than 534 nm. The sub epitaxial structure EP2 located in the region R1 has a first photoluminescent wavelength within the first photoluminescent wavelength range, such as 535 nm. As described above, the region R1 is a non-deviation region. In a particular example based on the color type that is green light, the standard peak wavelength range is not larger than 536 nm and not shorter than 534 nm; the peak wavelength corresponding to the sub pixel unit SP2 is 535 nm and falls within the standard peak wavelength range. That is, when the luminous area of the sub pixel unit SP2 is a standard area, the sub pixel unit SP2 is driven by a current to emit light whose first photoluminescent wavelength is within a tolerant range, and does not need to additionally adjust the luminous area of the sub pixel unit SP2. Therefore, the luminous area of the sub pixel unit SP2 is substantially equal to the standard area. Similarly, the luminous area of the sub pixel unit SP8 of the pixel unit P3 is substantially equal to the standard area. On the other hand, the sub pixel unit SP5 of the pixel unit P2 formed from the sub epitaxial structure EP5 corresponds to the region R2 of the epitaxial wafer W. The region R2 has a second photoluminescent wavelength range which is larger than 536 nm. The sub epitaxial structure EP5 located in the region R2 has a second photoluminescent wavelength within the second photoluminescent wavelength range, such as 537 nm. As described above, the region R2 is a positive deviation region. In a particular example, the standard peak wavelength range is not larger than 536 nm and not shorter than 534 nm. In this condition, the peak wavelength corresponding to the sub pixel unit SP5 is, for example, 537 nm and is larger than the upper limitation of the standard peak wavelength range. That is, when the luminous area of the sub pixel unit SP5 is a standard area, the sub pixel unit SP5 is driven by a current to emit light whose second electroluminescent wavelength exceeds the upper limitation of the tolerant range, so that it is necessary to additionally adjust the luminous area of the sub pixel unit SP5. Therefore, the luminous area of the sub pixel unit SP5 is smaller than the standard area.

Since different photoluminescent wavelengths in the regions R1 and R2, the first photoluminescent wavelength of the sub epitaxial structure EP2 is smaller than the second photoluminescent wavelength of the sub epitaxial structure EP5. Herein, suppose a condition that the sub epitaxial structures EP2 and EP5 have the same luminous area, it is conceivable that the sub pixel units SP2 and SP5 have the same luminous area, and thus the first electroluminescent wavelength of the sub pixel unit SP2 is smaller than the second electroluminescent wavelength of the sub pixel unit SP5 under the same driving current. Hence, the sub pixel units SP2 and SP5 emit the same color type light but in different photoluminescent wavelengths, such that it is unfavorable for a uniform and harmonious screen of the display device 1.

In order to compensate for the difference between the first photoluminescent wavelength and the second photoluminescent wavelength, during the fabrication of sub pixel units, the size of the sub epitaxial structure EP5 is adjusted so as to make the first luminous area of the sub pixel unit SP2 larger than the second luminous area of the sub pixel unit SP5. Thus, under the same driving current, the first electroluminescent wavelength of the sub pixel unit SP2 is the same as or similar to the second electroluminescent wavelength of the sub pixel unit SP5. For example, the size of the sub epitaxial structure EP5 is adjusted such that the difference between the electroluminescent wavelengths of sub pixel units SP2 and SP5 is less than or equal to 2 nm, and thus the first sub pixel unit and the second sub pixel unit can emit same color type light within the same or similar photoluminescent wavelength. In another aspect, the luminous area of the sub pixel unit SP5 corresponding to a high deviation region is smaller than the luminous area of the sub pixel unit SP2 corresponding to a non-deviation region. For example, the luminous area of the sub pixel unit SP5 is 90% of the luminous area of the sub pixel unit SP2. Therefore, the peak wavelength of light emitted by the sub pixel unit SP5 may almost fall within the standard peak wavelength range. Since the difference between the first photoluminescent wavelength and the second photoluminescent wavelength is larger than the difference between a first electroluminescent wavelength of the first sub pixel unit and a second electroluminescent wavelength of the second sub pixel unit. The sizes of the sub epitaxial structures are adjusted according to the difference between the photoluminescent wavelengths, such that the sub pixel units formed from respective sub epitaxial structures have similar electroluminescent wavelength, making light emitted by the sub pixel units is uniform for achieving harmonious screen of the display device 1.

The sub pixel unit SP11 of the pixel unit P4 corresponds to the region R4 of the epitaxial wafer W. The region R4 has a third photoluminescent wavelength range which is shorter than 534 nm. The sub epitaxial structure EP11 located in the region R4 has a third photoluminescent wavelength within the third photoluminescent wavelength range, such as 533 nm. As described above, the region R4 is a negative deviation region. In a particular example, the standard peak wavelength range is not larger than 536 nm and not shorter than 534 nm. In this condition, the peak wavelength corresponding to the sub pixel unit SP11 is, for example, 533 nm that is shorter than the lower limitation of the standard peak wavelength range. That is, when the luminous area of the sub pixel unit SP11 is a standard area, the sub pixel unit SP11 is driven by a current to emit light whose third photoluminescent wavelength is shorter than the lower limitation of the tolerant range, so that it is necessary to additionally adjust the luminous area of the sub pixel unit SP11. Therefore, the luminous area of the sub pixel unit SP11 is larger than the standard area. That is, the luminous area of the sub pixel unit SP11 is larger than the luminous area of the sub pixel unit SP2.

Since different photoluminescent wavelengths in the regions R1 and R4, the first photoluminescent wavelength of the sub epitaxial structure EP2 is larger than the third photoluminescent wavelength of the sub epitaxial structure EP11. Herein, suppose a condition that the sub epitaxial structures EP2 and EP11 have the same luminous area, it is conceivable that the sub pixel units SP2 and SP11 have the same luminous area, and thus the first electroluminescent wavelength of the sub pixel unit SP2 is larger than the third electroluminescent wavelength of the sub pixel unit SP11 under the same driving current. Hence, the sub pixel units SP2 and SP11 emit the same color type light but in different photoluminescent wavelengths.

In order to compensate for the difference between the first photoluminescent wavelength and the third photoluminescent wavelength, during the fabrication of sub pixel units, the size of the sub epitaxial structure EP11 is adjusted so as to make the third luminous area of the sub pixel unit SP11 larger than the first luminous area of the sub pixel unit SP2. Thus, under the same driving current, the first electroluminescent wavelength of the sub pixel unit SP2 is the same as or similar to the third electroluminescent wavelength of the sub pixel unit SP11. For example, the difference between the electroluminescent wavelengths of sub pixel units SP2 and SP11 is less than or equal to 2 nm.

In another aspect, the luminous area of the sub pixel unit SP11 corresponding to a negative deviation region is larger than the luminous area of the sub pixel unit SP2 corresponding to a non-deviation region. For example, the luminous area of the sub pixel unit SP11 is 110% of the luminous area of the sub pixel unit SP2. In this way, the peak wavelength of light emitted by the sub pixel unit SP11 may almost fall within the standard peak wavelength range.

Similar to the sub pixel unit SP11, the luminous area of the sub pixel unit SP14 is larger than a standard area. The region R5 has a fourth photoluminescent wavelength range which is shorter than 534 nm. The sub epitaxial structure EP14 located in the region R5 has a fourth photoluminescent wavelength within the fourth photoluminescent wavelength range, such as 531 nm. In this embodiment, the peak wavelength corresponding to the sub pixel unit SP14 is, for example, 531 nm and is shorter than the peak wavelength corresponding to the sub pixel unit SP11. That is, when the luminous area of the sub pixel unit SP14 is a standard area, the sub pixel unit SP14 is driven by a current to emit light whose fourth photoluminescent wavelength deviates from the lower limitation of the tolerant range more than the peak wavelength of light emitted by the sub pixel unit SP11. Therefore, the luminous area of the sub pixel unit SP14 is larger than not only the standard area but also the luminous area of the sub pixel unit SP11. Therefore, the peak wavelength of light emitted by the sub pixel unit SP14 may almost fall within the standard peak wavelength range.

Herein, suppose a condition that the sub epitaxial structures EP11 and EP14 have the same luminous area, it is conceivable that the sub pixel units SP11 and SP14 have the same luminous area, and thus the third electroluminescent wavelength of the sub pixel unit SP11 is larger than the fourth electroluminescent wavelength of the sub pixel unit SP14 under the same driving current. Hence, the sub pixel units SP11 and SP14 emit the same color type light but in different photoluminescent wavelengths.

In order to compensate for the difference between the third photoluminescent wavelength and the fourth photoluminescent wavelength, during the fabrication of sub pixel units, the size of the sub epitaxial structure EP14 is adjusted so as to make the fourth luminous area of the sub pixel unit SP14 larger than the third luminous area of the sub pixel unit SP11. Thus, under the same driving current, the third electroluminescent wavelength of the sub pixel unit SP11 is the same as or similar to the fourth electroluminescent wavelength of the sub pixel unit SP14. For example, the difference between the electroluminescent wavelengths of sub pixel units SP11 and SP14 is less than or equal to 2 nm.

Moreover, considering the compensation for the difference between the first photoluminescent wavelength, the third photoluminescent wavelength and the fourth photoluminescent wavelength, the size of the sub epitaxial structure EP14 is adjusted so as to make the fourth luminous area of the sub pixel unit SP14 larger than the third luminous area of the sub pixel unit SP11, and the third luminous area is larger than the first luminous area of the sub pixel unit SP2. Thus, the sub pixel units SP2, SP11 and SP14 have the same or similar electroluminescent wavelength, with the difference between the electroluminescent wavelengths of any two of the sub pixel units is less than or equal to 2 nm.

Briefly, when the peak wavelength corresponding to a sub pixel unit falls within a standard peak wavelength range, the luminous area of the sub pixel unit is a standard area. When the peak wavelength corresponding to a sub pixel unit is larger than a standard peak wavelength range, the luminous area of the sub pixel unit is smaller than the standard area. When the peak wavelength corresponding to a sub pixel unit is shorter than a standard peak wavelength range, the luminous area of the sub pixel unit is larger than the standard area. The degree of deviation of the peak wavelength from the standard peak wavelength range affects the degree of adjustment in the luminous area of each sub pixel unit. By adjusting the luminous area of each sub pixel unit, the peak wavelength of light emitted by each sub pixel unit driven by a current is properly calibrated, so that each sub pixel unit that is driven can emit light with a peak wavelength falling within the standard peak wavelength range. In another embodiment, the luminous area can be properly calibrated according to the measured luminous intensity distribution or the luminous efficiency distribution in the photoluminescence measurement result. When the measured intensity distribution or luminous efficiency corresponding to a sub pixel unit is in the standard intensity distribution or luminous efficiency range, the luminous area of this sub pixel unit is a standard area. When the measured intensity distribution or luminous efficiency corresponding to a sub pixel unit is larger than the standard intensity distribution or luminous efficiency range, the luminous area of this sub pixel unit is smaller than the standard area. When the measured intensity distribution or luminous efficiency corresponding to a sub pixel unit is smaller than the standard intensity distribution or luminous efficiency range, the luminous area of this sub pixel unit is larger than the standard area. The degree of deviation of the measured intensity distribution or luminous efficiency from the standard intensity distribution or luminous efficiency range decides the degree of adjustment in luminous area for each sub pixel unit. By adjusting the luminous area of each sub pixel unit, the luminous intensity of light emitted by each sub pixel unit driven by a current may be properly calibrated, so that the luminous intensity of light emitted by each sub pixel unit that is driven may fall in the standard intensity distribution or luminous efficiency range.

In an embodiment, the sub pixel units of the same color type in the display device 1 can emit respective light having a difference in peak wavelength therebetween, which is not larger than 2 nm. As described in the aforementioned example, the standard peak wavelength range is not larger than 536 nm and not shorter than 534 nm, i.e. 535 nm±1 nm. Therefore, the screen of the display device 1 may become more uniform and harmonious.

Moreover, the exemplary description is based on green sub pixel units, and however, in practice, the luminous areas of red sub pixel units and blue sub pixel units can be adjusted by the foregoing method. Therefore, the sub pixel units of the same color type in the display device may have a substantially identical electroluminescent wavelength of emitted light, luminous intensity or luminous efficiency. In other words, as shown in FIG. 1A, for the display device experiencing calibration or manufacturing as described above, all luminous areas of the green sub pixel units may not be the same, all luminous areas of the red sub pixel units may not be the same, and all luminous areas of the blue sub pixel units may not be the same. The increase rate or decrease rates of the luminous areas of the sub pixel units of each color type can be adjusted according to particular requirements by one of ordinary skill in the art, and thus, they may be different.

As described above, in practice, the manufacturer can define a patterning process according to the photoluminescence measurement result, and define various luminous areas for sub epitaxial structures in the epitaxial structure in the patterning process, form sub pixel units having different luminous areas from the sub epitaxial structures in a chip manufacturing process, and then transfer the sub pixel units to a display substrate by mass transfer technology. Or, through such a defined patterning process, the luminous areas of all sub pixel units of the same color type are substantially and properly equalized, so that the manufacturing process can be simplified. Or, the manufacturer can define one universal patterning process or different universal patterning processes using one or more past photoluminescence measurement results, so as to get a balance between the manufacturing cost and the yield rate of production. The above exemplary description is based on a color type of sub pixel units, but one of ordinary skill in the art can simultaneously and respectively adjust luminous areas for more than one color type of sub pixel units in view of the disclosure.

According to the above embodiments, the disclosure provides a display device and an epitaxial structure. In an exemplary embodiment, the display device includes a first sub pixel unit and a second sub pixel unit, and the luminous areas of the first and second sub pixel units are related to the photoluminescence measurement result of a related epitaxial substrate in an epitaxial process. Therefore, the first and second sub pixel units formed based from the same epitaxial wafer may substantially have the same color of emitted light when the peak wavelength of light emitted by the first sub pixel unit and the peak wavelength of light emitted by the second sub pixel unit are appropriately calibrated.

What is claimed is:

1. A display device, comprising:
   a display substrate; and
   a plurality of pixel units, comprising:
   a first pixel unit located on the display substrate and comprising a first sub pixel unit having a first luminous area;
   a second pixel unit located on the display substrate and comprising a second sub pixel unit having a second luminous area; and
   a third pixel unit located on the display substrate and comprising a third sub pixel unit having a third luminous area, wherein the first luminous area, the second luminous area and the third luminous area are different from one another;
   wherein the first pixel unit and the second pixel unit are respectively located at a central region and an edge region of the display substrate, and a geometric shape of the first sub pixel unit and a geometric shape of the second sub pixel unit are same;
   wherein the first sub pixel unit, the second sub pixel unit and the third sub pixel unit belong to the same color type and are located in different pixel units, the first sub pixel unit is from a sub epitaxial structure emitting light within a first photoluminescent wavelength, the second sub pixel unit is from a sub epitaxial structure emitting light within a second photoluminescent wavelength, and the first photoluminescent wavelength is different from the second photoluminescent wavelength;
   wherein a difference between a first electroluminescent wavelength of the first sub pixel unit and a second electroluminescent wavelength of the second sub pixel unit is less than or equal to 2 nm.

2. The display device according to claim 1, wherein the sub epitaxial structure providing the first sub pixel unit and the sub epitaxial structure providing the second sub pixel unit are formed from a same epitaxial wafer.

3. The display device according to claim 2, wherein a relative location of the two sub epitaxial structures formed from the epitaxial wafer is substantially equal to a relative location of the first and second sub pixel units on the display substrate.

4. The display device according to claim 1, wherein the first photoluminescent wavelength is larger than the second photoluminescent wavelength, and the first luminous area is smaller than the second luminous area.

5. The display device according to claim 1, wherein the third sub pixel unit is from a sub epitaxial structure emitting light within a third photoluminescent wavelength, a difference between any two of the first electroluminescent wavelength of the first sub pixel unit, the second electroluminescent wavelength of the second sub pixel unit and a third electroluminescent wavelength of the third sub pixel unit is less than or equal to 2 nm;
   wherein the third photoluminescent wavelength is larger than the first photoluminescent wavelength, and the first photoluminescent wavelength is larger than the second photoluminescent wavelength;
   wherein the second luminous area is larger than the first luminous area, and the first luminous area is larger than the third luminous area.

6. The display device according to claim 1, further comprising a third pixel unit located on the display substrate and comprising a third sub pixel unit, the first pixel unit, the second pixel unit and the third pixel unit are linearly arranged in sequence;
   wherein the first sub pixel unit, the second sub pixel unit and the third sub pixel unit belong to the same color type and are located in different pixel units;
   wherein a minimum distance between the first sub pixel unit and the second sub pixel unit is different from a minimum distance between the second sub pixel unit and the third sub pixel unit.

7. The display device according to claim 1, wherein the first luminous area and the second luminous area have a same geometric shape.

8. The display device according to claim 1, wherein for any two pixel units each comprising a sub pixel unit belonging to a first color type and another sub pixel unit belonging to a second color type different from the first same color type, a sum of luminous areas of the sub pixel units belonging to the first color type is different from a sum of luminous areas of the sub pixel units belonging to the second color type.

9. The display device according to claim 8, wherein for any two pixel units each comprising a plurality of sub pixel units, a sum of luminous areas of the sub pixel units of one of the two pixel units is different from a sum of luminous areas of the sub pixel units of the other pixel unit.

10. The display device according to claim 1, wherein a difference between the first photoluminescent wavelength and the second photoluminescent wavelength is larger than the difference between a first electroluminescent wavelength of the first sub pixel unit and a second electroluminescent wavelength of the second sub pixel unit.

11. The display device according to claim 1, wherein the geometric shape of the first sub pixel unit and the geometric shape of the second sub pixel unit are rectangular.

12. The display device according to claim 1, wherein the plurality of pixel units further comprise:
    a third pixel unit located at the central region of the display substrate and comprising a third sub pixel unit having a third luminous area, wherein the third luminous area is different from the first luminous area and the second luminous area, and the third sub pixel unit has a same geometric shape as the first sub pixel unit and the second sub pixel unit;
    wherein the third sub pixel unit is from a sub epitaxial structure emitting light within a third photoluminescent wavelength, the third photoluminescent wavelength is different from the first photoluminescent wavelength and the second photoluminescent wavelength;
    wherein a difference between the first electroluminescent wavelength of the first sub pixel unit and a third electroluminescent wavelength of the third sub pixel unit is less than or equal to 2 nm.

13. The display device according to claim 12, wherein the geometric shape of the first sub pixel unit, the geometric shape of the second sub pixel unit and the geometric shape of the third sub pixel unit are rectangular.

14. The display device according to claim 1, wherein a standard photoluminescent wavelength range is defined as a specific value with a tolerance range from 1-8 nm, and at least one of the two sub epitaxial structures is out of the standard photoluminescent wavelength range.

15. A display device, comprising:
    a display substrate; and
    a plurality of pixel units, comprising:
    a first pixel unit located on the display substrate and comprising a first sub pixel unit having a first luminous area;
    a second pixel unit located on the display substrate and comprising a second sub pixel unit having a second luminous area, and the first luminous area and the second luminous area being different; and a third pixel unit located at the central region of the display substrate and comprising a third sub pixel unit having a third luminous area, wherein the third luminous area is different from the first luminous area and the second luminous area, and the third sub pixel unit has a same geometric shape as the first sub pixel unit and the second sub pixel unit;

wherein the first pixel unit and the second pixel unit are respectively located at a central region and an edge region of the display substrate, and a geometric shape of the first sub pixel unit and a geometric shape of the second sub pixel unit are same;

wherein the first sub pixel unit and the second sub pixel unit belong to the same color type, the first sub pixel unit and the second sub pixel unit are located in different pixel units, the first sub pixel unit is from a sub epitaxial structure emitting light within a first photoluminescent wavelength, the second sub pixel unit is from a sub epitaxial structure emitting light within a second photoluminescent wavelength, the third sub pixel unit is from a sub epitaxial structure emitting light within a third photoluminescent wavelength, and the first photoluminescent wavelength is different from the second photoluminescent wavelength, the third photoluminescent wavelength is different from the first photoluminescent wavelength and the second photoluminescent wavelength;

wherein a difference between a first electroluminescent wavelength of the first sub pixel unit and a second electroluminescent wavelength of the second sub pixel unit is less than or equal to 2 nm;

wherein a difference between the first electroluminescent wavelength of the first sub pixel unit and a third electroluminescent wavelength of the third sub pixel unit is less than or equal to 2 nm.

* * * * *